US009236064B2

(12) United States Patent
Savell

(10) Patent No.: US 9,236,064 B2
(45) Date of Patent: Jan. 12, 2016

(54) SAMPLE RATE CONVERTER WITH AUTOMATIC ANTI-ALIASING FILTER

(71) Applicant: Microsoft Corporation, Redmond, WA (US)

(72) Inventor: Thomas Craig Savell, Santa Cruz, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 268 days.

(21) Appl. No.: 13/765,686

(22) Filed: Feb. 12, 2013

(65) Prior Publication Data

US 2013/0211827 A1      Aug. 15, 2013

Related U.S. Application Data

(60) Provisional application No. 61/599,058, filed on Feb. 15, 2012.

(51) Int. Cl.
| | |
|---|---|
| *G10L 99/00* | (2013.01) |
| *G06F 12/00* | (2006.01) |
| *H03H 17/06* | (2006.01) |
| *G11B 20/10* | (2006.01) |

(52) U.S. Cl.
CPC ............... *G10L 99/00* (2013.01); *G06F 12/00* (2013.01); *H03H 17/0685* (2013.01); *G11B 20/10037* (2013.01); *G11B 20/10046* (2013.01); *G11B 2220/2516* (2013.01)

(58) Field of Classification Search
None
See application file for complete search history.

(56) References Cited

U.S. PATENT DOCUMENTS

| | | | |
|---|---|---|---|
| 5,054,085 A * | 10/1991 | Meisel et al. | 704/207 |
| 6,055,619 A | 4/2000 | North et al. | |
| 6,463,406 B1 * | 10/2002 | McCree | 704/207 |
| 7,376,475 B2 | 5/2008 | Fay et al. | |
| 8,098,255 B2 | 1/2012 | Fouladi et al. | |
| 2002/0107594 A1 | 8/2002 | Taylor et al. | |
| 2004/0024590 A1 * | 2/2004 | Lee | 704/207 |
| 2004/0220801 A1 * | 11/2004 | Sato | 704/207 |
| 2008/0034161 A1 * | 2/2008 | Savell | 711/118 |
| 2008/0127182 A1 | 5/2008 | Newport et al. | |
| 2012/0216226 A1 | 8/2012 | Humphrey et al. | |

OTHER PUBLICATIONS

"API Migration Guide: Managed DirectX 1.1 to XNA Framework", Available at: http://msdn.microsoft.com/en-us/library/bb197956(v=xnagamestudio.30).aspx, Retrieved on: Oct. 12, 2012, 15 pages.

"Power Efficient Multimedia Playback on Mobile Platforms", Retrieved on: Oct. 12, 2012, 20 pages.

* cited by examiner

*Primary Examiner* — Jeremiah Bryar
(74) *Attorney, Agent, or Firm* — Gregg Wisdom; Judy Yee; Micky Minhas

(57) ABSTRACT

The subject disclosure is directed towards dynamically computing anti-aliasing filter coefficients for sample rate conversion in digital audio. In one aspect, for each input-to-output sampling rate ratio (pitch) obtained, anti-aliasing filter coefficients are interpolated based upon the pitch (e.g., using the fractional part of the ratio) from two filters (coefficient sets) selected based upon the pitch (e.g., using the integer part of the ratio). The interpolation provides for fine-grained cutoff frequencies, and by re-computation for each pitch, smooth anti-aliasing with dynamically changing ratios.

20 Claims, 7 Drawing Sheets

SAMPLE RATE CONVERTER WITH AUTOMATIC ANTI-ALIASING FILTER

CROSS-REFERENCE TO RELATED APPLICATION

The present application claims priority to U.S. provisional patent application Ser. No. 61/599,058, filed Feb. 15, 2012.

BACKGROUND

In digital audio technology, sample rate conversion refers to changing the rate at which a digital audio stream is output relative to the sampling rate at which the stream was input, producing a new digital audio stream that represents the same analog waveform, with a different sampling rate and a potentially different audio bandwidth. The applications for this in a digital audio system include playback and mixing of multiple streams at input sampling rates that differ from the system rate, and producing variation in pitch, duration, and timbre of interactive audio streams such as sounds in a video game or musical instrument.

Aliasing is a well-known phenomenon in digital audio that occurs when the sampling rate is too low relative to some of the sampled frequency components, causing frequencies to be shifted due to higher frequency waveform cycles occasionally being skipped during the sampling. To prevent aliasing, frequencies above the Nyquist frequency, defined as one-half of the sampling frequency, are filtered out. For example, if using a sampling rate of 48 KHz, an anti-aliasing filter is used to filter out frequency components above 24 KHz.

A common implementation for sample rate converters, such as those used in computer soundcards, have finite impulse response (FIR) filters that filter via stored coefficient sets, e.g., typically four selectable filter coefficient sets. For sample rate converters such as these, the sample input-rate-to-output-rate ratio is used to select one of the filter coefficient sets, which provides the filter cutoff frequency for anti-aliasing filtering.

However, one problem is that this solution limits sample rate conversion to using one of the four cutoff frequencies. This works in some fixed rate scenarios, but still compromises the audio quality in other scenarios, in that selecting among four filters is not particularly fine-grained with respect to the many possible sample rate ratios that may be used.

Another problem is when sample rate conversion is used with dynamically changing ratios, such as to change a sample's pitch over time to simulate the sound of an engine being revved up (or down) in a racing game, or to simulate the Doppler effect for a listener having a relative velocity to a sound source. Indeed, with an audio stream played back with a dynamically changing ratio, audibly noticeable undesirable artifacts occur if the filter coefficients are suddenly changed after a number of sample periods, or if the filter coefficients are not changed at all. In short, the use of such fixed filter cutoff frequencies compromises the audio quality for many fixed-ratio scenarios and nearly all time-varying ratio scenarios.

SUMMARY

This Summary is provided to introduce a selection of representative concepts in a simplified form that are further described below in the Detailed Description. This Summary is not intended to identify key features or essential features of the claimed subject matter, nor is it intended to be used in any way that would limit the scope of the claimed subject matter.

Briefly, various aspects of the subject matter described herein are directed towards a technology in which sample rate conversion is performed with anti-aliasing digital filtering using fine-grained filtering coefficients that are automatically computed based upon the ratio of the input (sampling) rate to the output rate, often referred to as the "pitch" herein. In one aspect, a pitch (value) is obtained. Described is selecting one filter (e.g., "A") comprising one set of coefficient values based upon the pitch, and another filter (e.g., "B") comprising another set of coefficient values based upon the pitch. A resultant set of pitch-based coefficient values is obtained, including by interpolating between the one set of coefficient values corresponding to the one filter ("A) and the other set of coefficient values corresponding to the other filter ("B). Data corresponding to the input sample is filtered, using the resultant set of pitch-based coefficient values, to provide for anti-aliasing filtering of the sampling rate converted sample for output. The selection and interpolation process may be repeated for a pitch change, whereby fine-grained dynamic anti-aliasing filtering facilitates sample rate conversion with dynamically changing ratios.

In one aspect, a sample rate conversion component is configured to convert an input sample into audio output based upon a specified pitch value. The sample rate conversion component may be coupled to a coefficient lookup table set. When the sample rate conversion component obtains a pitch value, the sample rate conversion component automatically reads a plurality of sets of filtering coefficients from the coefficient lookup table set based upon the pitch value, and automatically interpolates the sets of filtering coefficients based upon the pitch value into anti-aliasing filtering coefficients for use by a digital audio filter.

In one aspect, audio data corresponding to an input sample is accessed. Described is obtaining as a current pitch value a value corresponding to a ratio of an input sampling rate of the input sample to an output sampling rate for outputting a converted output of the input sample. Also described is an interpolation step, including interpolating between filter coefficient sets based upon the current pitch value to obtain a filtering coefficient set; anti-aliasing filtering is performed using the filtering coefficient set and audio data is output that corresponds to the converted output after anti-aliasing filtering. When a changed pitch value is obtained, described is returning to the interpolation step for obtaining a (changed) filtering coefficient set for anti-aliasing filtering for audio data output.

Other advantages may become apparent from the following detailed description when taken in conjunction with the drawings.

BRIEF DESCRIPTION OF THE DRAWINGS

The present invention is illustrated by way of example and not limited in the accompanying figures in which like reference numerals indicate similar elements and in which.

DETAILED DESCRIPTION

Various aspects of the technology described herein are generally directed towards an audio sample-rate converter that automatically calculates anti-aliasing filter coefficients based on the current ratio of the input and output sample rates, (sometimes referred to as pitch), which results in the output of audio with greater perceived quality. More particularly, the technology described herein computes the anti-aliasing filter coefficients used in sample-rate converters to attenuate frequency content above the lower of the input and output Nyquist frequencies. When the sample-rate ratio is dynamically changing, such as when using the ratio for pitch-bending or Doppler-shift simulation operations, this change may be done on a sample-by-sample basis.

To this end, instead of suddenly changing filter coefficients between samples when the ratio changes sufficiently to select another set, described herein is a bilinear interpolation mechanism with a number of (e.g., four) discrete filter coefficient sets. The interpolation automatically computes appropriate coefficients for each ratio (pitch), providing a fine-grained and smooth change in the cutoff frequency for each changed ratio for each output sample. Having the sample-rate converter dynamically calculate the filter coefficients on each sample period provides more desirable audio quality on each output sample, without the disturbing artifacts that otherwise occur by suddenly changing filter coefficients after a number of sample periods, or by not changing the filter coefficients.

It should be understood that any of the examples herein are non-limiting. For example, in one or more embodiments exemplified herein, an upsampling factor of thirty-two is described, four sets of filter coefficients are used, an eight-TAP finite impulse response (FIR) filter (split into parallel processing paths) is used, and so on. However, other values may be used in other embodiments. As such, the present invention is not limited to any particular embodiments, aspects, concepts, structures, functionalities or examples described herein. Rather, any of the embodiments, aspects, concepts, structures, functionalities or examples described herein are non-limiting, and the present invention may be used various ways that provide benefits and advantages in computing and audio technology in general.

Figure 1:
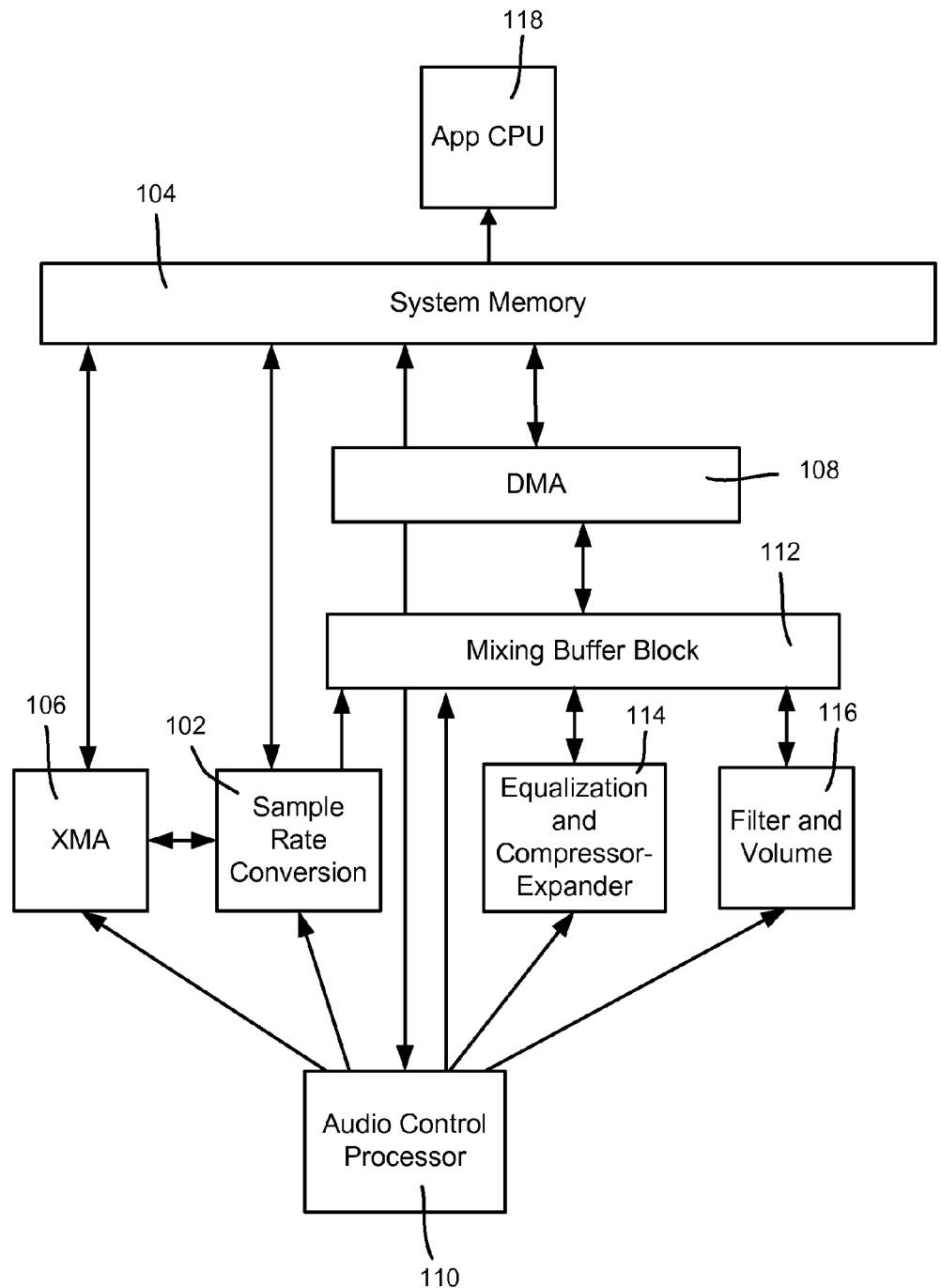
FIG. 1 is a block diagram showing various example components of a sound processing environment, including a sample rate conversion component, according to one example embodiment.

FIG. 1 shows an example sound processing environment (e.g., in a game console) including a sample rate conversion block 102 that uses interpolation of filter coefficients as described herein. In general, compressed audio data (e.g., referred to as XMA data) is stored in main system memory 104 and processed by an XMA decoder block 106. The XMA decoder block 106 decodes a portion of the stored XMA data and returns the decoded data (PCM samples) to the main system memory 104, e.g., into an XMA decode buffer.

When directed by an audio control processor 110, the sample rate conversion block 102 reads (e.g., via its own memory interface) the PCM samples from the XMA decode buffer and performs sample rate conversion/pitch shifting. This allows audio data of an arbitrary sampling rate to be brought into the sound processing environment's accelerator blocks. In one implementation, upon processing, the audio data runs at a fixed sampling rate of 48,000 Hz and is output to a mixing buffer block 112.

Additional processing may be done by other hardware blocks that operate on the data, reading from the mixing buffer (or buffers) and writing to other mixing buffer (or buffers). Some of these other hardware blocks are represented in FIG. 1 as the equalization and compressor-expander block 114 and the filter and volume block 116. Allocated speaker mixing buffers collect and mix the samples from multiple sounds for speaker playback and (optionally) global audio effects processing buffers In addition to performing the audio processing within the fixed function blocks, the environment provides a straightforward mechanism to augment the processing with arbitrary Digital Signal Processing (DSP) performed on the main application CPU (App CPU) 118. This is facilitated with a set of DMA engines/block 108 that transport data between the mixing blocks and main application memory 104. Note that the App CPU 118 may perform its DSP processing, including writing its output to output buffers within main system memory into a mixing buffer, before additional processing is done on the data, e.g., via blocks 114 and 116.

When a sample rate conversion pass is needed, the audio control processor receives a suitable (e.g., SRC) command, e.g., originated from the application CPU 118. As described above, the sample rate conversion block 102 fetches input sample data from system memory via its own memory interface. More particularly, in one implementation, the sample rate conversion block 102 makes a request to the mixing buffer block with the physical buffer ID(s) of the current command in its processing queue. If not currently in use by another device, the mixing buffer block locks down the buffer (s) for use by the sample rate conversion block 102 and acknowledges that the buffer(s) can be used. After positive acknowledgement from the mixing buffer block, the sample rate conversion block 102 checks the number of samples available in the system memory buffer before proceeding. If the number of samples is insufficient (e.g., to make a frame), the sample rate conversion block 102 block releases the lock on the mix buffer(s) without writing the buffer(s). If there are enough samples in system memory to generate a desired number of (e.g., 128 in this example) output samples, the sample rate conversion block 102 fetches the samples from system memory and writes 128 samples into the mix buffer (s), accumulating the results with any previous results. Once the 128th sample is received by the mix buffer block, the state for the output buffer(s) are updated, and a completion status is sent back to the sample rate conversion block including a peak magnitude value.

Figure 2A:
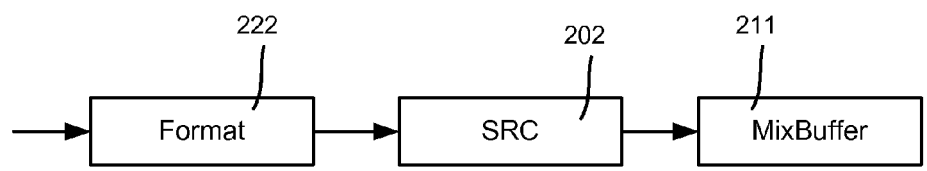
FIGS. 2A and 2B are example representations of components of a sample rate conversion block for processing mono and stereo data, respectively, according to example embodiments.
Figure 2B:
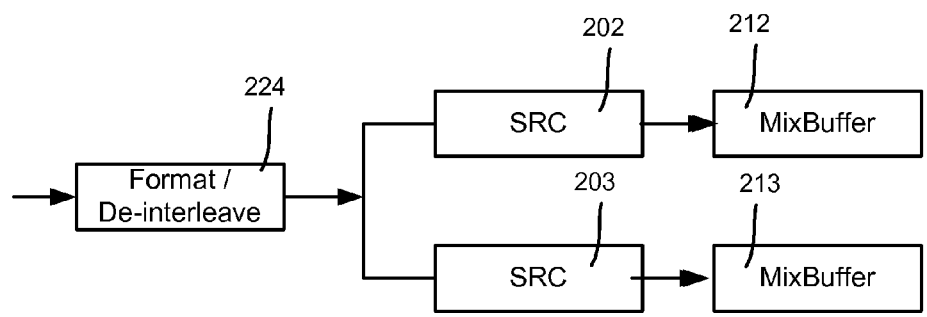

As represented in FIGS. 2A and 2B, sample rate conversion (SRC) operates in one of two modes, namely MONO (FIG. 2A), or STEREO (FIG. 2B). In MONO mode, data sample(s) are read from system memory on a sample-by-sample basis and written (after sample rate conversion 202) to a mixing buffer (a temporary MixBuffer) shown as block 211. In STEREO mode, the data sample(s) are interpreted as interleaved (Left/Right) stereo PCM data; each channel is output (after sample rate conversion 202 or 203) to a separate mixing buffer (temporary MixBuffers) shown as block 212 or block 213. This allows for high performance with a minimum of memory re-reads. Note that for purposes of simplicity, a single sample rate conversion block 102 is generally described herein.

As shown in FIG. 2A, there are two main stages in the SRC block, namely Format 222 and SRC 202. Format reads the incoming audio data, e.g., in 16-bit fixed-point, 24/32-bit fixed-point or 32-bit floating-point and converts the data to the internal (e.g., 24-bit fixed-point) format used by the rest of the block. In STEREO mode, the format block also reads and separates the interleaved PCM data, and thus is represented in FIG. 2B by format/de-interleave block 224. The format block 222 or 224 also checks the read and write pointers to determine if there is sufficient audio data present in the PCM buffer to generate one audio frame's worth of output, with the method varying depending on whether the data is maintained by software or the hardware XMA decoder. The SRC block 202 (and for stereo also block 203) performs the sample rate conversion. Although input to the SRC block may be at any sampling rate up to 384 kHz minus epsilon, the output data is a constant 48 kHz in one implementation.

The format block includes a floating-point to fixed-point converter and clamping logic as well as select logic and muxes used to handle/read interleaved sample data. The output of the Format block is s0.23. s0.15 inputs are padded with zeros, s0.23 are passed through, and s0.31 inputs are truncated, using only the most significant 24 bits of the word. 32-bit float values are converted such that −1.0 maps to 0x800000, 0.0 maps to 0x000000, and 1.0 is clamped to 0x7fffff according to the following:

```
if (floatingPointData >= 1.0) {
    fixedPointData = 0x7fffff;
} else if (floatingPointData < −1.0) {
    fixedPointData = 0x800000
} else {
    fixedPointData = (int)(0x800000 * floatingPointData);
}
```

Additional checks may be used for NaN ("Not a Number") and Infinity detection and conversion. Infinities are clamped to the maximum positive and negative values, e.g., +Inf is clamped to 0x7fffff and −Inf is clamped to 0x800000. NaNs are forced to zeros (0).

Turning to aspects of sample rate conversion, described herein is an example algorithm that first upsamples the input stream by a factor (e.g., thirty-two (32)), filters the upsampled stream to remove components that will cause aliases, and then downsamples the stream to create the output at the desired output rate. In the factor of thirty-two example, the upsample operation is performed by inserting thirty-one (31) zeroes between each of the original input samples.

In one implementation, the filter is a standard 8-Tap Finite Impulse Response (FIR) filter performed by convolution of an impulse response with the input data. The downsample operation is as straightforward as selecting individual samples from the upsampled and filtered stream. Note that the FIR filter computation is reduced by not performing multiply-add operations on the inserted zeroes, as multiplying by zero results in zero, and adding such a zero results in no change to the accumulator (and is therefore unnecessary).

The sample rate conversion block 102 implements an 8-tap polyphase FIR filter with 32 subphases, linear interpolation between subphases, and linear interpolation between different filter coefficient sets to optimize the filter cutoff for the conversion ratio.

The 8-tap polyphase FIR filter is a time-domain convolution, implementing the following mathematical relationship between input signal x and output signal y:

$$y_i = \sum_{n=0}^{7} c_n x_{i-n}$$

where i is the time series index, n is the filter tap number, and c, is the polyphase filter coefficient for tap n.

In one implementation, in order to meet performance requirements with headroom, the datapath needs to complete in four clock cycles. Note that the exemplified sample rate conversion block is able to support 512 channels running concurrently; at a 250 MHz operation frequency, this is approximately one sample output every ten cycles. The datapath can output one sample every four cycles, so it meets performance targets with context fetch/store and memory latency overhead.

To achieve completion in four clock cycles, in one implementation, a convolution engine (FIG. 3) of the sample rate conversion block instantiates two parallel units, one which operates on the even-numbered taps, and the other on the odd-numbered taps. The equivalent algebraic expression is:

$$y_i = \sum_{n=0,2,4,6} c_n x_{i-n} + \sum_{n=1,3,5,7} c_n x_{i-n}$$

Figure 3:
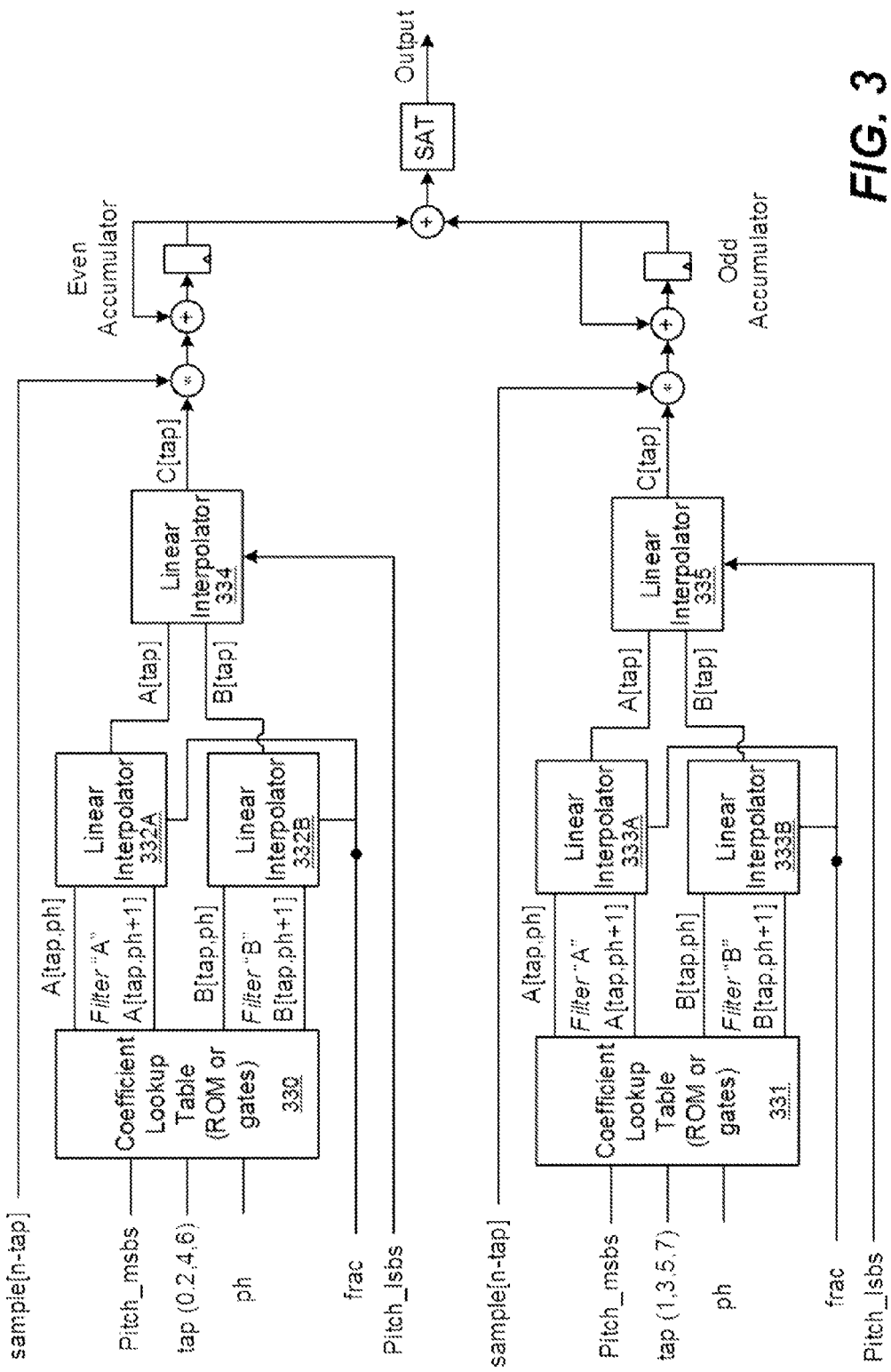
FIG. 3 is a block diagram showing parallel paths for performing interpolation based anti-aliasing filtering of a sample in a sample rate conversion component, according to one example embodiment.

An example of such a parallel architecture is exemplified in FIG. 3.

Note that (per path) there are two distinct interpolations performed, one based on phase and the other based on pitch. Note that "phase" refers to the relative position of the current output sample to the input sample stream. This position can be "in-between" samples such that the phase needs to have a fractional component. The phase is basically a sample address, but it can address in between samples.

As exemplified in FIG. 3, the sample rate converter performs the phase-based interpolation first, followed by the pitch-based interpolation; however it is understood that performing the interpolations in the opposite order (i.e., first performing pitch-based interpolation, followed by the phase-based interpolation) is arithmetically equivalent and may be used at one's discretion to achieve equivalent results. The pitch-based interpolation as described herein optimizes the filter cutoff frequency for the lower of the two Nyquist frequencies, whereas the (known) phase-based interpolation performs the actual sample rate conversion by combining the upsampling and decimation operations.

In the exemplified implementation, there are four SRC FIR filters (sets of filter coefficients), numbered 0 to 3. The SRC block's convolution engine selects two of the four filters (e.g., from the coefficient values maintained in coefficient lookup table set comprising at least one coefficient lookup table in ROM or gates 330, 331) based upon the conversion ratio as described below, and automatically interpolates between filters to provide for more fine-grained filtering selection. Moreover, in the event that the conversion ratio changes over time, per sample filter selection and interpolation provides for a smoothly changing frequency response.

In the implementation shown in FIG. 3, the four filters are each 8-taps, 32 subphases, and symmetric about a unique center point, leading to a full filter length of 257 coefficients. Due to the symmetry, there are 129 unique coefficients. The 8-tap FIR filter is symmetric, and is therefore linear-phase. The group delay is a constant, equal to 4 (input) samples.

Figure 4:
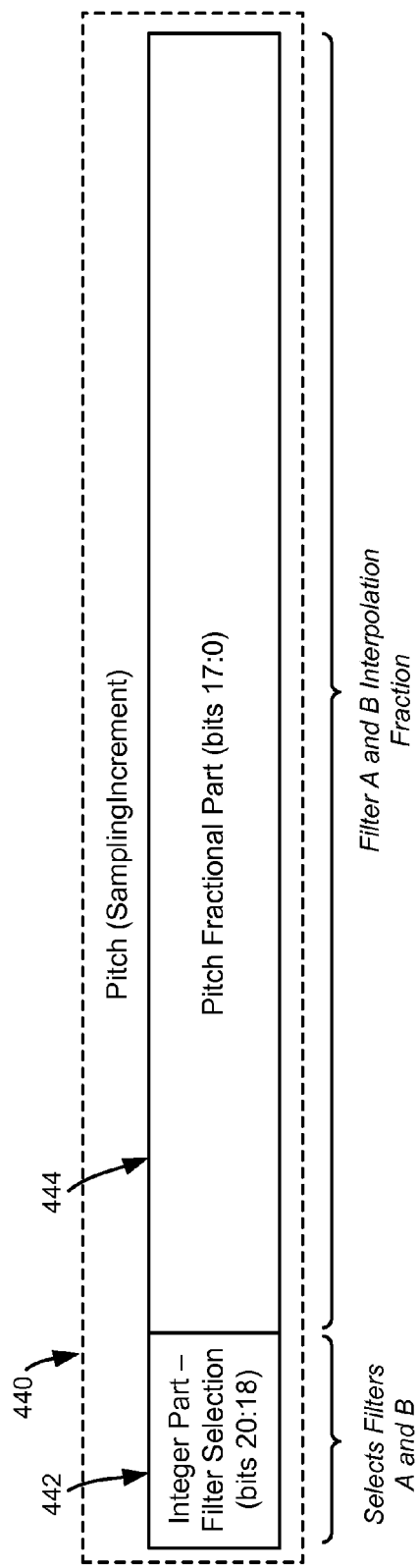
FIG. 4 is a representation of how an input-to-output ratio (pitch), represented in binary data, may be divided into parts for filter selection and interpolation, according to one example embodiment.

The sample rate conversion block interpolates between two filters using the Sampling Increment (Pitch) to select the filters and provide the linear interpolation fraction. Note that the filter pair selection is automatic based upon the pitch value; no determination needs to be made by the program providing the audio sample as to which filter to use. As generally represented in FIGS. 3 and 4, given the pitch (440, FIG. 4) in binary data, the integer part (442, FIG. 4) of the Pitch, (e.g., bits 20:18 of the Sampling Increment field in one implementation), selects the filters, A and B, as shown in the table below:

| Filter Selection by Pitch | | |
|---|---|---|
| Pitch Integer | Filter A | Filter B |
| 0 | 0 | 0 |
| 1 | 0 | 1 |
| 2 | 1 | 2 |
| 3 | 2 | 3 |
| 4-7 | 3 | 3 |

Note that the table shows filters uniformly separated based upon the integer results. It is feasible to have non-uniformly separated filters and/or with some non-integer-only selection, e.g., a set of filters including a filter for 0 to 1.0, a filter for above 1.0 to 1.5, a filter for above 1.5 to 3.0, and a filter for above 3.0. Note that more than four filters may be available for selecting among them. Further note that the interpolation fraction is based upon the separation.

Still further, integer and fractional parts are only one example way to divide the pitch; indeed, the most significant bits need not correspond to an integer exactly, nor do the least significant bits need to correspond to a fraction exactly. For example, using eight filters across the same range of pitches would use the "integer" bits plus the most significant bit of the fraction to select the filters. Arbitrary or non-integer cutoffs as described above may use different sets of bits for selection, e.g., a filter for pitch 0.0-1.5, another for 1.5-2.25, another for 2.25-2.75 and so forth are not selectable strictly by an integer value. Thus, as used herein, "integer" and "fraction" or "fractional" (with respect to both pitch and phase) are only example terms for purposes of simplifying the description.

Moreover, the bit groups may be reversed or otherwise manipulated as desired in a given implementation, e.g., the least significant bits may be used to select the filters, and the most significant bits used for interpolation. One or more rotate instructions, for example, can manipulate the bit groups as desired. Thus, as used herein, the terms "least" significant bits and "most" significant bits represent bit groupings that may be manipulated in any way, e.g., reversing them, such as before the actual filter selection and interpolation operations, is equivalent to using them without any manipulation.

The fractional part 444 of the pitch 440, bits 17:0 of the SamplingIncrement field, forms the interpolation fraction. The linear interpolation follows the relation:

$$c_i = a_i + \text{pitchFrac}^*(b_i - a_i)$$

where $a_i$ is a filter coefficient from filter A and $b_i$ is the corresponding filter coefficient from filter B. In one implementation, the multiplier used is eighteen bits unsigned by fourteen bits signed, as the maximum difference between filters fits within fourteen bits.

Figure 5:
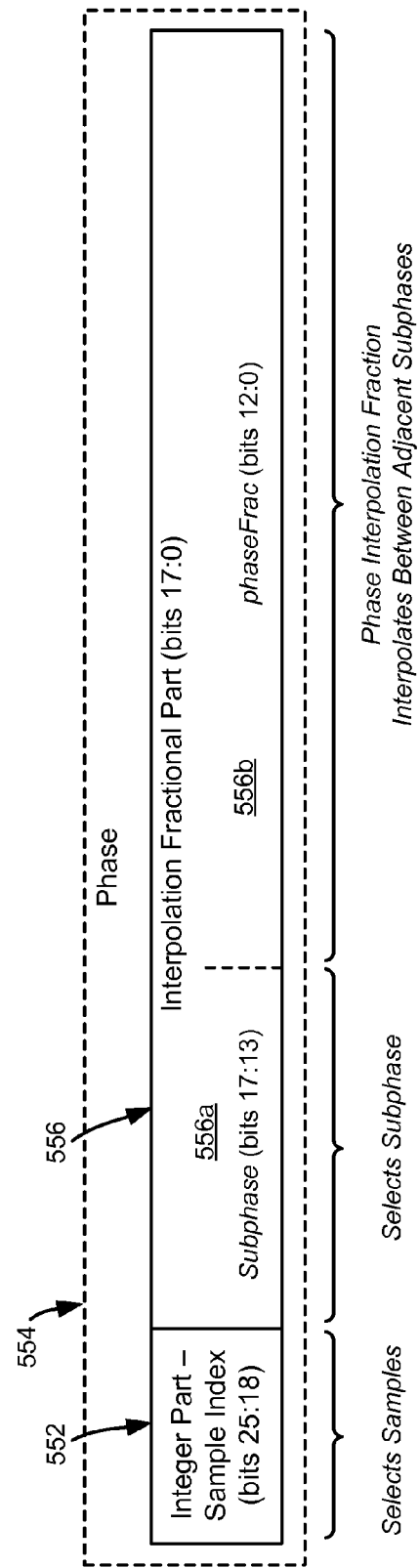
FIG. 5 is a representation of how a phase may be divided into parts for sample selection, subphase selection and interpolation, according to one example embodiment.

In the following example with respect to phase, sample rate conversion filtering as described herein is described below with respect to coefficients obtained via ROM addressing. More particularly, the sample rate conversion block 102 addresses into each filter table using the tap and subphase as follows:

$$\text{romAddr} = 32^*\text{tap} + \text{subphase}$$

where the tap is an integer convolution index ranging from 0 to 7. The samples in one implementation are selected via the integer part 552 of the phase 554, e.g., bits 25:18 as represented in FIG. 5. The selected subphase corresponds to the most significant five bits 556a (bits 17:13) of the fractional part of the phase 554, as generally exemplified in FIG. 5. The phase interpolation fraction 556b is represented by the least significant bits of the fractional part, e.g., bits 12:0 in FIG. 5.

With respect to FIR filter pitch interpolation, the filter pitch interpolation step tracks the filter cutoff frequency to the lower of the two Nyquist frequencies in the system, based on the input and output sample rates. The four filters (sets of coefficients) are effectively multiplied by $2^{18}$ (262,144) by interpolating between them. Note that a property of these types of filters is that the frequency response curves can be interpolated between them by interpolating between the filter coefficients.

As can be seen, in this example implementation, the sample rate conversion block linearly interpolates between two adjacent filter subphases for each tap, effectively increasing the phase precision, and thereby increasing the precision of the conversion ratio. As also represented in FIGS. 3 and 5, the filter subphases are selected by the most significant five bits 556a of the fractional part 556 of the phase; the least significant thirteen bits 556b of the fractional part 556 form the phase interpolation fraction, as follows:

$$\text{subphase} = \text{SamplePointer}[17:13]$$

$$\text{phaseFrac} = \text{SamplePointer}[12:0]$$

Note that one embodiment has more variables to carry the upper bits of the sample address, and the number of integer bits or the like that are considered significant thus varies with the format of the input data; the data may comprise a current pointer to the input sample for SRC in u7.18 or u6.18 format. In modes except stereo, this value has seven bits of integer and eighteen bits of fraction. The seven-bit integer combines with the buffer read pointer to form a full buffer index with the read pointer in the most significant bits, and this seven-bit integer in the least significant bits. In stereo mode, the most significant bit of the phase is ignored and assumed to be zero (hardware will force it to zero if a software error inadvertently programs it to '1'). This effectively makes phase a twenty-four-bit field with six bits of integer and eighteen bits of fraction in stereo mode. Thus, bits 24:18 or bits 23:18 may represent the integer portion of the pointer depending on stereo or mono modes, with bits 17:0 used for the fractional portion of the pointer.

Other variables or parameters that contribute to the actual sample address are the BufferStart and the ReadPtr. For sample rate conversion point of view, the ReadPtr is used, as it is an offset from the BufferStart address. It is only for creating the final memory address that BufferStart is used. The top fourteen bits of ReadPtr are concatenated with the integer portion (top seven bits) of the SamplePointer to specify the initial input sample read position. ReadPtr is a "sample" pointer, meaning that it has sample granularity. ReadPtr is frame (128-sample) aligned, which means that the least significant seven bits are ignored by hardware and assumed to be zero. ReadPtr specifies an offset from Buffer-Start where the input starts, and that the next sample will be read from. The concatenation of ReadPtr and SamplePointer can be considered the "Phase".

The two adjacent subphases are indicated by subphase and subphase+1, and when considered with the filter ROM addressing described above, leads to the following selection for subphase interpolation (blocks 332A and 332B, and 333A and 333B in FIG. 3):

$$a_j = \text{filter}A[32*\text{tap}+\text{subphase}]$$

$$a_k = \text{filter}A[32*\text{tap}+\text{subphase}+1]$$

$$b_j = \text{filter}B[32*\text{tap}+\text{subphase}]$$

$$b_k = \text{filter}B[32*\text{tap}+\text{subphase}+1]$$

In one implementation, the multiplier used is thirteen bits unsigned by eleven bits signed, as the maximum difference between adjacent subphases fits within eleven bits.

Given these {filter, tap and subphase} results, the linear interpolation shown in blocks 334 and 335 of FIG. 3, in which the least significant thirteen bits of the fractional part form the phase interpolation fraction, is as follows:

$$a_i = a_j + \text{phaseFrac}*(a_k - a_j)$$

$$b_i = b_j + \text{phaseFrac}*(b_k - b_j)$$

In one implementation, the multiplier used is eighteen bits unsigned by fourteen bits signed, as the maximum difference between filters fits within fourteen bits.

After phase interpolation, pitch interpolation is performed as described above (although the order may be reversed). Note that in an optimization, in one implementation interpolation is performed even when the pitch is such that the same filter coefficient set is selected for filter A and filter B. For example, for a pitch integer of zero (input-to-output ratio below one), from the above table it is seen that filter 0 is selected for both A and B. Although no changes in the coefficient values result, this simplifies the logic.

The results of the pitch interpolation at blocks 334 and 335, provide the (per-tap) coefficient $c_n$ that is multiplied (represented in FIG. 3 by the convolution/circled "*" characters, one for the even taps, one for the odd taps) times the input $x_{i-n}$:

$$y_i = \sum_{n=0,2,4,6} c_n x_{i-n} + \sum_{n=1,3,5,7} c_n x_{i-n}$$

In one implementation, the multiplier used is sixteen bits signed by twenty-four bits signed. As shown in the above formula summations, these per-tap products are accumulated into the even or odd accumulators (represented in FIG. 3 by the circled "+" character). The even and odd accumulators are then combined into the output.

Figure 6:
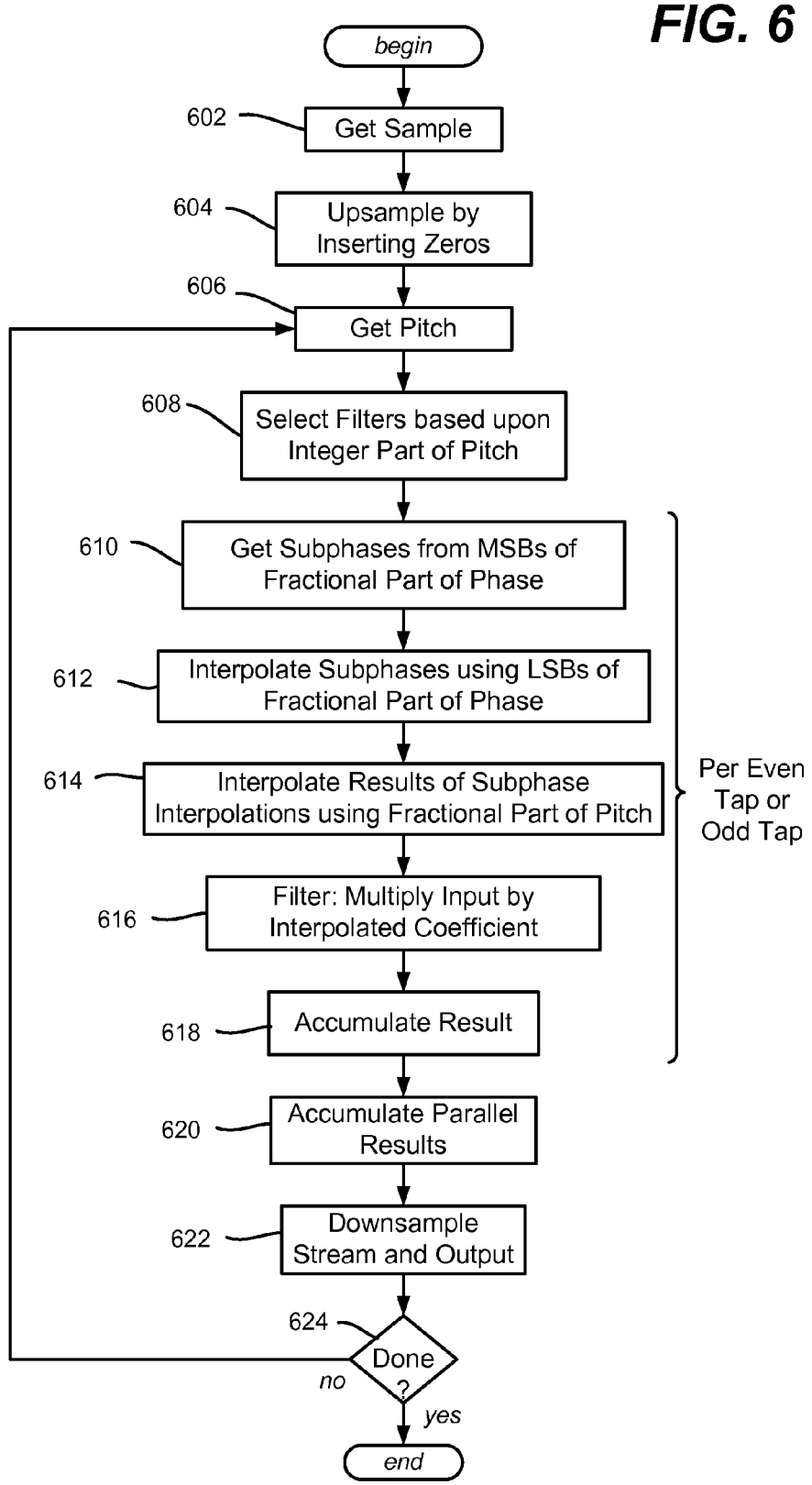
FIG. 6 is a flow diagram showing example steps that may be used in pitch-based filter selection and interpolation, according to one example embodiment.

FIG. 6 is a flow diagram showing example steps taken to automatically select and interpolate filter coefficients for anti-aliasing in sample rate conversion for an input sample obtained (e.g., accessed in memory) at step 602. Step 604 upsamples the sample as desired for a given implementation, e.g., by a factor of thirty-two, as described above.

Step 606 represents getting the conversion ratio/pitch value (e.g., one or more parameters) from the application or the like that is requesting the conversion. As will be understood, the same sample may be used with whatever current pitch value is currently provided (or computed). Note that step 606 refers to getting a pitch (which may be varied over time), such as a pitch value provided by an application, however as is understood, the application may provide parameters or the like from which the pitch is computed. For example, the application may specify the input rate and the output rate from which the pitch may be computed, the application may provide a starting and ending pitch (or starting and ending output rate) and a time (or number of frames or the like) over which the pitch is to be varied, and so forth. Thus, step 606 also represents any computations that may be done to determine the pitch value if not provided directly.

Step 608 represents using the integer part of the pitch value (e.g., represented in bits 20:18 as described above) to select a filter pair comprising sets of coefficients for filters A and B, e.g., using the table set forth above. Note that the above table is for four filters/coefficient sets, however as can be readily appreciated, selection may be made from among a different number of filters.

Steps 610 and 612 are directed towards subphase interpolation (of adjacent subphases) as described above. The most significant bits (e.g., bits 17:13) of the fractional part of the phase value provide the subphase values used in subphase interpolation, and the least significant bits (e.g. bits 12:0) provide the interpolation fraction. Note that steps 610 and 612 are per tap, and occur in parallel for even and odd taps in one implementation.

Step 614 represents interpolating the results of the subphase interpolations using the least significant bits (e.g., bits 12:0) of the fractional part (e.g. bits 17:0) of the pitch value. At this time, the interpolated coefficient for the appropriate tap is known, and used at step 616 in the anti-aliasing filtering computation. Step 618 represents accumulating the result for the taps; note that steps 614, 616 and 618 are also per tap, using parallel paths as appropriate for a given implementation.

Step 620 represents accumulating the parallel results. At step 622, the final results are then output as audio data for further processing by other blocks as desired, after downsampling as appropriate.

Step 624 repeats the process by returning to step 606 until the sample rate converter is instructed to end or otherwise stops for this input sample. As can be seen, returning to step 606 allows for anti-aliasing filtering that is smooth for dynamic pitch changes. By way of example, consider a gaming application such as a driving game. To simulate the increase or decrease in revving an engine's RPMs (revolutions per minute), it is desirable to sample an engine running at a given RPM and then change the sampling rate over time. By changing the input to output ratio/pitch value at step 606, the output changes, with smooth and fine grained anti-aliasing filtering performed for each iteration. Another example uses the relative velocity of a sound source and listener to compute the ratio at any time to simulate the Doppler shift.

Example Operating Environment

It can be readily appreciated that the above-described implementation and its alternatives may be implemented on any suitable computing device, including a gaming system, personal computer, tablet, DVR, set-top box, smartphone and/or the like. Combinations of such devices are also feasible when multiple such devices are linked together. For purposes of description, a gaming (including media) system is described as one exemplary operating environment hereinafter.

Figure 7:
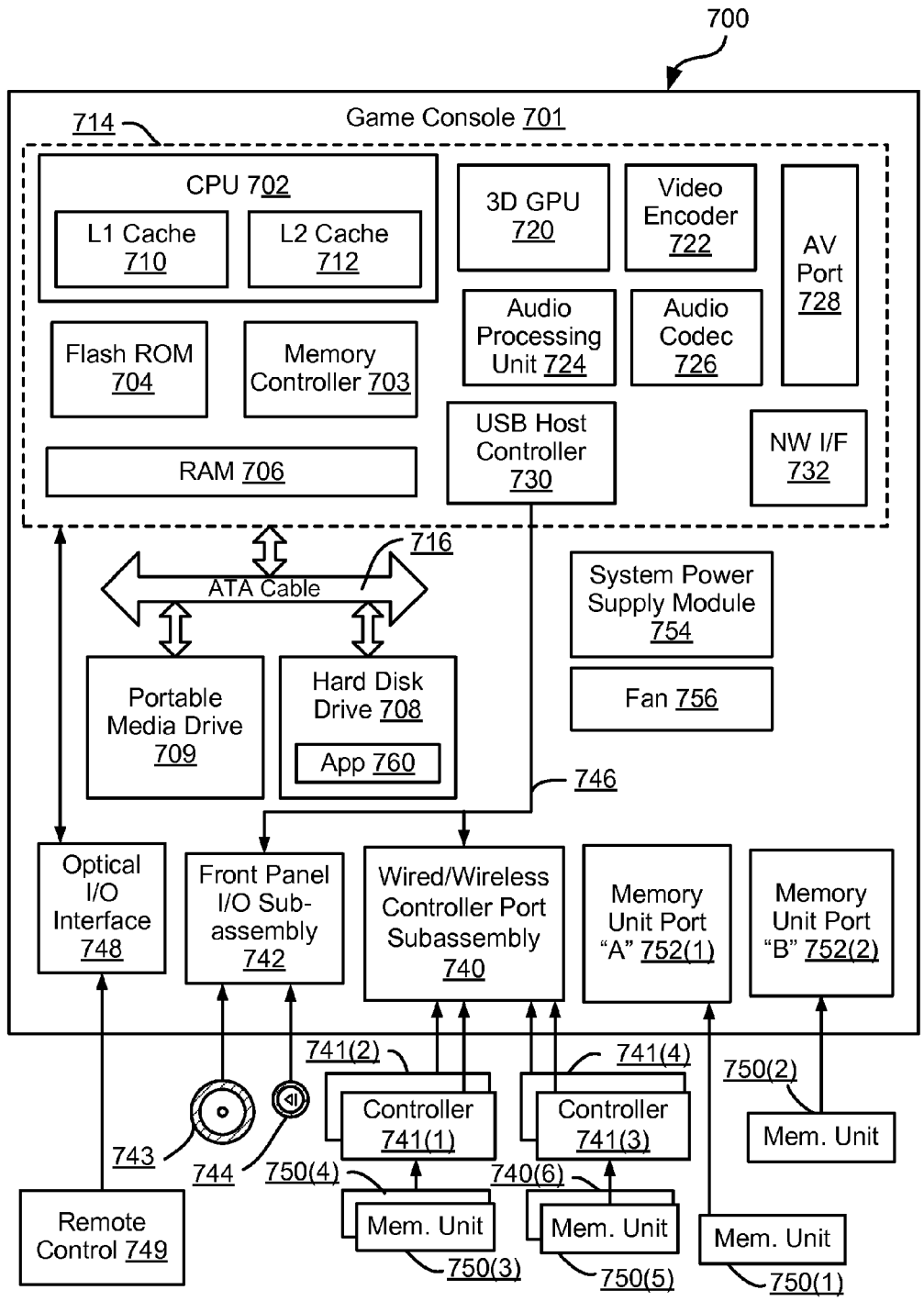
FIG. 7 is a block diagram representing an example computing environment, in the example of a game console, into which aspects of the subject matter described herein may be incorporated.

FIG. 7 is a functional block diagram of an example gaming and media system 700 and shows functional components in more detail. Console 701 has a central processing unit (CPU) 702, and a memory controller 703 that facilitates processor access to various types of memory, including a flash Read Only Memory (ROM) 704, a Random Access Memory (RAM) 706, a hard disk drive 708, and portable media drive 709. In one implementation, the CPU 702 includes a level 1 cache 710, and a level 2 cache 712 to temporarily store data and hence reduce the number of memory access cycles made to the hard drive, thereby improving processing speed and throughput.

The CPU 702, the memory controller 703, and various memory devices are interconnected via one or more buses (not shown). The details of the bus that is used in this implementation are not particularly relevant to understanding the subject matter of interest being discussed herein. However, it will be understood that such a bus may include one or more of serial and parallel buses, a memory bus, a peripheral bus, and a processor or local bus, using any of a variety of bus architectures. By way of example, such architectures can include an Industry Standard Architecture (ISA) bus, a Micro Channel Architecture (MCA) bus, an Enhanced ISA (EISA) bus, a Video Electronics Standards Association (VESA) local bus, and a Peripheral Component Interconnects (PCI) bus also known as a Mezzanine bus.

In one implementation, the CPU 702, the memory controller 703, the ROM 704, and the RAM 706 are integrated onto a common module 714. In this implementation, the ROM 704 is configured as a flash ROM that is connected to the memory controller 703 via a Peripheral Component Interconnect (PCI) bus or the like and a ROM bus or the like (neither of which are shown). The RAM 706 may be configured as multiple Double Data Rate Synchronous Dynamic RAM (DDR SDRAM) modules that are independently controlled by the memory controller 703 via separate buses (not shown). The hard disk drive 708 and the portable media drive 709 are shown connected to the memory controller 703 via the PCI bus and an AT Attachment (ATA) bus 716. However, in other implementations, dedicated data bus structures of different types can also be applied in the alternative.

A three-dimensional graphics processing unit 720 and a video encoder 722 form a video processing pipeline for high speed and high resolution (e.g., High Definition) graphics processing. Data are carried from the graphics processing unit 720 to the video encoder 722 via a digital video bus (not shown). An audio processing unit 724 and an audio codec (coder/decoder) 726 form a corresponding audio processing pipeline for multi-channel audio processing of various digital audio formats. Audio data are carried between the audio processing unit 724 and the audio codec 726 via a communication link (not shown). The video and audio processing pipelines output data to an A/V (audio/video) port 728 for transmission to a television or other display/speakers. In the illustrated implementation, the video and audio processing components 720, 722, 724, 726 and 728 are mounted on the module 714.

FIG. 7 shows the module 714 including a USB host controller 730 and a network interface (NW I/F) 732, which may include wired and/or wireless components. The USB host controller 730 is shown in communication with the CPU 702 and the memory controller 703 via a bus (e.g., PCI bus) and serves as host for peripheral controllers 734. The network interface 732 provides access to a network (e.g., Internet, home network, etc.) and may be any of a wide variety of various wire or wireless interface components including an Ethernet card or interface module, a modem, a Bluetooth module, a cable modem, and the like.

In the example implementation depicted in FIG. 7, the console 701 includes a controller support subassembly 740, for supporting four game controllers 741(1)-741(4). The controller support subassembly 740 includes any hardware and software components needed to support wired and/or wireless operation with an external control device, such as for example, a media and game controller. A front panel I/O subassembly 742 supports the multiple functionalities of a power button 743, an eject button 744, as well as any other buttons and any LEDs (light emitting diodes) or other indicators exposed on the outer surface of the console 701. The subassemblies 740 and 742 are in communication with the module 714 via one or more cable assemblies 746 or the like. In other implementations, the console 701 can include additional controller subassemblies. The illustrated implementation also shows an optical I/O interface 748 that is configured to send and receive signals (e.g., from a remote control 749) that can be communicated to the module 714.

Memory units (MUs) 750(1) and 750(2) are illustrated as being connectable to MU ports "A" 752(1) and "B" 752(2), respectively. Each MU 750 offers additional storage on which games, game parameters, and other data may be stored. In some implementations, the other data can include one or more of a digital game component, an executable gaming application, an instruction set for expanding a gaming application, and a media file. When inserted into the console 701, each MU 750 can be accessed by the memory controller 703.

A system power supply module 754 provides power to the components of the gaming system 700. A fan 756 cools the circuitry within the console 701.

An application 760 comprising machine instructions is typically stored on the hard disk drive 708. When the console 701 is powered on, various portions of the application 760 are loaded into the RAM 706, and/or the caches 710 and 712, for execution on the CPU 702. In general, the application 760 can include one or more program modules for performing various display functions, such as controlling dialog screens for presentation on a display (e.g., high definition monitor), controlling transactions based on user inputs and controlling data transmission and reception between the console 701 and externally connected devices.

The gaming system 700 may be operated as a standalone system by connecting the system to high definition monitor, a television, a video projector, or other display device. In this standalone mode, the gaming system 700 enables one or more players to play games, or enjoy digital media, e.g., by watching movies, or listening to music. However, with the integration of broadband connectivity made available through the network interface 732, gaming system 700 may further be operated as a participating component in a larger network gaming community or system.

CONCLUSION

While the invention is susceptible to various modifications and alternative constructions, certain illustrated embodiments thereof are shown in the drawings and have been described above in detail. It should be understood, however, that there is no intention to limit the invention to the specific forms disclosed, but on the contrary, the intention is to cover all modifications, alternative constructions, and equivalents falling within the spirit and scope of the invention.

What is claimed is:

1. A method comprising:
   obtaining a pitch corresponding to an input audio sampling rate of an input sample and an output audio rate for a sample rate converted sample;
   selecting one filter comprising one set of coefficient values based upon the pitch;
   selecting another filter comprising another set of coefficient values based upon the pitch;

obtaining a resultant set of pitch-based coefficient values by interpolating between the one set of coefficient values corresponding to the one filter and the other set of coefficient values corresponding to the other filter; and filtering data corresponding to the input sample to provide for anti-aliasing of the sampling rate converted sample for output using the resultant set of pitch-based coefficient values.

2. The method of claim 1 wherein interpolating between the one set of coefficient values corresponding to the one filter and the other set of coefficient values corresponding to the other filter comprises:

performing one subphase interpolation between a subphase identified from the phase and a subphase adjacent thereto to obtain one subphase interpolation result;

performing another subphase interpolation between a second subphase identified from the phase and a second subphase adjacent thereto to obtain another subphase interpolation result; and performing an interpolation between the one subphase interpolation result and the other subphase interpolation result to obtain the resultant set of pitch-based coefficient values.

3. The method of claim 1 wherein filtering the sample rate converted sample for output using the resultant set of pitch-based coefficient values comprises:

providing the data corresponding to the input sample to a plurality of parallel filtering paths, respective ones of the plurality of parallel filtering paths corresponding to a subset of filter taps;

filtering using the resultant set of pitch-based coefficient values for the respective ones of the plurality of filtering paths; and combining the filtering results of the parallel filtering paths for the output.

4. The method of claim 1 further comprising:

upsampling the sample before filtering the data corresponding to the input sample, the filtering the data corresponding to the input sample further comprising filtering into a filtered upsampled sample comprising the data corresponding to the input sample; and downsampling the filtered upsampled sample before the output.

5. The method of claim 1 wherein selecting the one filter based upon the pitch and selecting the other filter based upon the pitch comprises using part of the pitch represented by one or more most significant bits to select the one filter and the other filter from among a plurality of available filters.

6. The method of claim 5 wherein the one filter is different from the other filter.

7. The method of claim 5 wherein selecting the one filter based upon the pitch and selecting the other filter based upon the pitch comprises selecting a same filter-as the one filter and the other filter.

8. The method of claim 1 further comprising:

obtaining a new pitch corresponding to a second input audio sampling rate of a second input sample and a second output audio rate for a second sample rate converted sample;

selecting a third filter comprising a third set of coefficient values based upon the new pitch;

selecting a fourth filter comprising a fourth set of coefficient values based upon the new pitch;

obtaining a new resultant set of pitch-based coefficient values by interpolating between the third set of coefficient values corresponding to the third filter and the fourth set of coefficient values corresponding to the fourth filter; and filtering a second set of data corresponding to the second input sample to provide for a second anti-aliasing of the second sample rate converted sample for a second output using the new resultant set of pitch-based coefficient values.

9. The method of claim 1 wherein the input sample corresponds to interleaved stereo channel data, and wherein the method further comprises de-interleaving the interleaved stereo channel data into the input sample.

10. A system comprising:

a sample rate conversion component configured to:

convert an input sample into audio output based upon a specified pitch value, the sample rate conversion component coupled to a coefficient lookup table and further configured to obtain a pitch value;

automatically read a plurality of sets of filtering coefficients from the coefficient lookup table set based upon at least part of the pitch value; and based upon at least part of the pitch value, automatically interpolate the sets of filtering coefficients into anti-aliasing filtering coefficients for use by a digital audio filter.

11. The system of claim 10 wherein the digital audio filter comprises a plurality of taps, and wherein the sample rate conversion component includes parallel paths for subsets of the taps, respective one of the parallel paths providing anti-aliasing filtering coefficients corresponding to the subsets of the taps for that path.

12. The system of claim 10 wherein the sample rate conversion component is further configured to:

automatically select two selected filters based upon at least part of the pitch value; and read the plurality of sets of filtering coefficients from the coefficient lookup table set based upon the two selected filters.

13. The system of claim 12 wherein the pitch value corresponds to a ratio of an input sample rate to an output sample rate, and wherein the sample rate conversion component automatically selects the two selected filters based upon at least a part of the ratio represented by one or more most significant bits.

14. The system of claim 10 wherein the pitch value corresponds to a ratio of an input sample rate to an output sample rate, and wherein the sample rate conversion component automatically interpolates the sets of filtering coefficients based upon at least some fractional part of the ratio.

15. The system of claim 10 wherein the sample rate conversion component is further configured to upsample the input sample before automatically interpolating the sets of filtering coefficients into the anti-aliasing filtering coefficients.

16. The system of claim 10 wherein interpolating the sets of filtering coefficients into the anti-aliasing filtering coefficients comprises:

performing subphase interpolations into subphase interpolation results; and based upon pitch data, interpolating the subphase interpolation results into the anti-aliasing filtering coefficients.

17. The system of claim 10 wherein the sample rate conversion component is further configured to:

obtain a plurality of varying pitch values over time; and provide a plurality of varying anti-aliasing filtering coefficients for respective pitch values.

18. One or more computer-readable storage devices having computer-executable instructions that cause the one or more processor to perform operations comprising:

accessing audio data corresponding to an input sample;

obtaining, as a current pitch value, a value corresponding to a ratio of an input sampling rate of the input sample to an output sampling rate for outputting a converted output of the input sample;

interpolating between filter coefficient sets based upon the current pitch value to obtain a filtering coefficient set;

performing anti-aliasing filtering using the filtering coefficient set;

outputting a first set of audio data corresponding to the converted output after performing anti-aliasing filtering;

obtaining, as the current pitch value, a changed pitch value corresponding to a changed ratio of the input sampling rate of the input sample to the output sampling rate for outputting a converted output of the input sample;

interpolating between the filter coefficient sets based upon the changed pitch value to obtain a second filtering coefficient set;

performing anti-aliasing filtering using the second filtering coefficient set; and outputting a second set of audio data corresponding to the converted output after performing anti-aliasing filtering using the second filtering coefficient set.

19. The one or more computer-readable storage devices of claim 18 having further computer-executable instructions that cause the one or more processor to perform an operation comprising selecting two filter coefficient sets based upon the pitch value for interpolating between the two filter coefficient sets.

20. The one or more computer-readable storage media devices of claim 18 having further computer-executable instructions that cause the one or more processors to perform an operation comprising upsampling the first set of audio data.

* * * * *